United States Patent
Ishikawa et al.

(10) Patent No.: US 10,135,398 B2
(45) Date of Patent: Nov. 20, 2018

(54) POWER AMPLIFICATION MODULE

(71) Applicant: Murata Manufacturing Co., Ltd., Kyoto (JP)

(72) Inventors: Mizuho Ishikawa, Kyoto (JP); Satoshi Sakurai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/814,883

(22) Filed: Nov. 16, 2017

(65) Prior Publication Data
US 2018/0145635 A1 May 24, 2018

(30) Foreign Application Priority Data

Nov. 21, 2016 (JP) ................ 2016-225898

(51) Int. Cl.
| | |
|---|---|
| G06G 7/12 | (2006.01) |
| H03F 1/02 | (2006.01) |
| H03F 3/195 | (2006.01) |
| H03F 3/21 | (2006.01) |
| H03F 3/213 | (2006.01) |
| H03F 3/60 | (2006.01) |
| H04B 1/00 | (2006.01) |
| H04B 1/18 | (2006.01) |
| H04B 1/401 | (2015.01) |
| H05K 1/02 | (2006.01) |

(52) U.S. Cl.
CPC .......... *H03F 1/0277* (2013.01); *H03F 3/195* (2013.01); *H03F 3/211* (2013.01); *H03F 3/213* (2013.01); *H03F 3/602* (2013.01); *H04B 1/0053* (2013.01); *H04B 1/18* (2013.01); *H04B 1/401* (2013.01); *H03F 2200/451* (2013.01); *H05K 1/0237* (2013.01)

(58) Field of Classification Search
None
See application file for complete search history.

(56) References Cited

U.S. PATENT DOCUMENTS

| | | | |
|---|---|---|---|
| 7,839,217 B2 | 11/2010 | Okuma | |
| 2013/0250820 A1* | 9/2013 | Khlat | H04B 1/0057 370/280 |
| 2016/0191105 A1 | 6/2016 | King | |
| 2016/0308500 A1 | 10/2016 | Luo et al. | |
| 2017/0294951 A1* | 10/2017 | Weissman | H03F 3/19 |

FOREIGN PATENT DOCUMENTS

JP 2016-042700 A 3/2016

* cited by examiner

*Primary Examiner* — Long Nguyen
(74) *Attorney, Agent, or Firm* — Pearne & Gordon LLP

(57) ABSTRACT

A power amplification module includes first and second amplifiers for first and second communication modes, a bypass line that bypasses the first or second amplifier, an input switch circuit that supplies a radio frequency signal to the first or second amplifier in accordance with a communication mode when a desired output level is equal to or greater than a reference level and supplies a radio frequency signal to the bypass line when the desired output level is less than the reference level, and an output switch circuit that outputs a first amplified signal from the first amplifier or a second amplified signal from the second amplifier in accordance with the communication mode when the desired output level is equal to or greater than the reference level and outputs a radio frequency signal output from the bypass line when the desired output level is less than the reference level.

18 Claims, 6 Drawing Sheets

POWER AMPLIFICATION MODULE

This application claims priority from Japanese Patent Application No. 2016-225898 filed on Nov. 21, 2016. The content of this application is incorporated herein by reference in its entirety.

BACKGROUND

The present disclosure relates to a power amplification module. A power amplification module is used in a mobile communication device such as a cellular phone device in order to amplify the power of a radio frequency (RF) signal that is to be transmitted to a base station. In recent years, power amplification modules having configurations capable of supporting RF signals of a plurality of different communication standards (modes) have become known. For example, Japanese Unexamined Patent Application Publication No. 2016-42700 discloses a power amplifier system that includes a first block having a first power amplifier that operates in a first mode, and a second block having a second power amplifier that operates in a second mode.

When amplifying an RF signal, the output level that is required in order to transmit the RF signal to the base station differs depending on the mode or frequency band of the RF signal, for example. Regarding this point, there is a problem with the configuration disclosed in Japanese Unexamined Patent Application Publication No. 2016-42700 in that all RF signals are amplified by the power amplifiers regardless of the output levels of the RF signals, and therefore current is excessively consumed when performing power amplification.

BRIEF SUMMARY

The present disclosure was made in light of the above-described circumstances, and the present disclosure provides a power amplification module that can reduce current consumption.

A power amplification module according to an embodiment of the present disclosure includes: a first amplifier that is used for a first communication mode; a second amplifier that is used for a second communication mode; a bypass line that bypasses the first or second amplifier; an input switch circuit that supplies a radio frequency signal to the first or second amplifier in accordance with a communication mode in a case where a desired output level is equal to or greater than a reference level, and that supplies a radio frequency signal to the bypass line in a case where the desired output level is less than the reference level; and an output switch circuit that outputs a first amplified signal output from the first amplifier or a second amplified signal output from the second amplifier in accordance with the communication mode in the case where the desired output level is equal to or greater than the reference level, and that outputs a radio frequency signal output from the bypass line in the case where the desired output level is less than the reference level.

According to the embodiment of the present disclosure, a power amplification module can be provided that can reduce current consumption.

Other features, elements, and characteristics of the present disclosure will become more apparent from the following detailed description of embodiments of the present disclosure with reference to the attached drawings.

DETAILED DESCRIPTION

Figure 1:
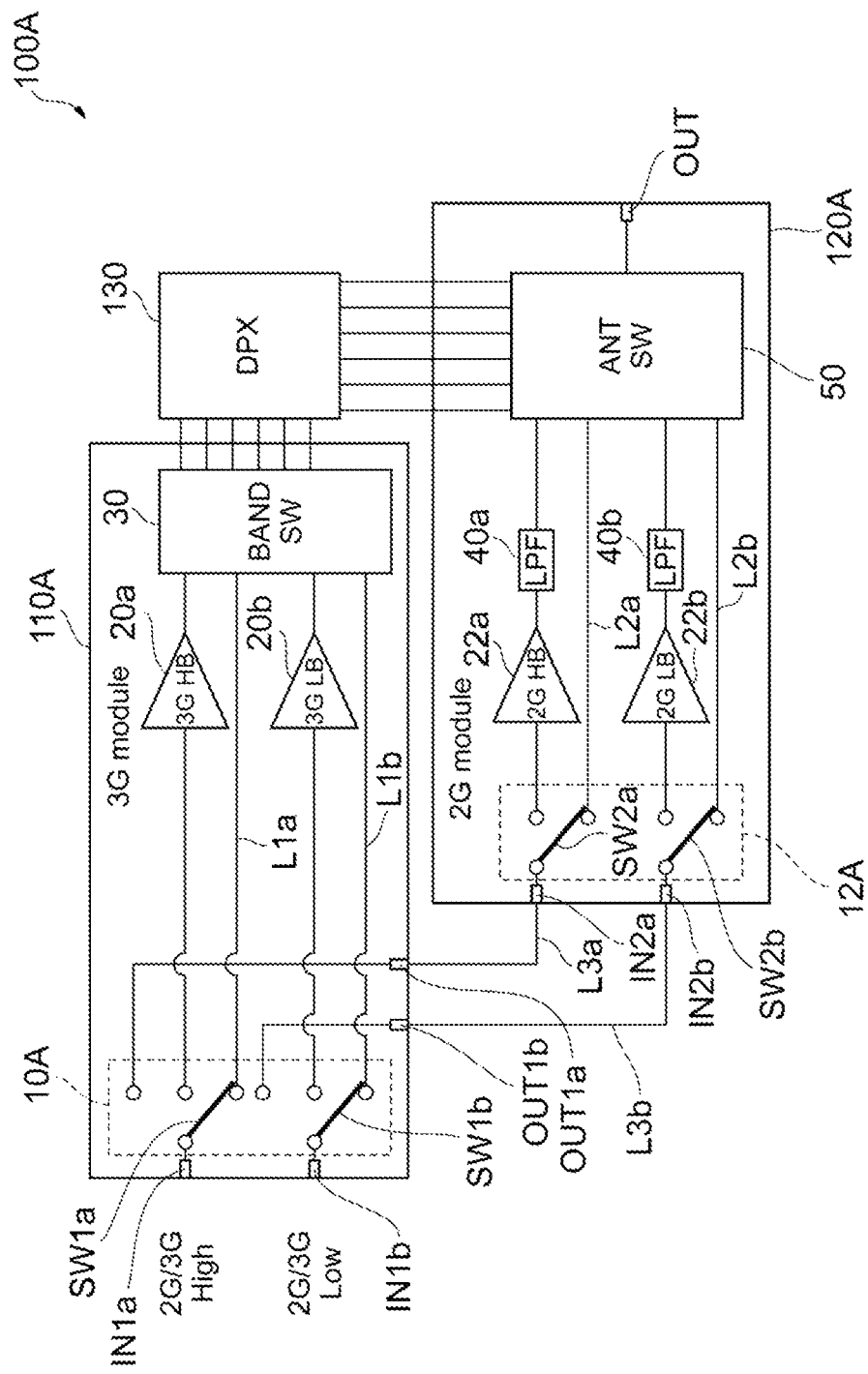
FIG. 1 illustrates the configuration of a power amplification module according to a first embodiment of the present disclosure.

Hereafter, embodiments of the present disclosure will be described in detail while referring to the drawings. Elements that are the same as each other will be denoted by the same symbols and repeated description thereof will be omitted.

FIG. 1 illustrates the configuration of a power amplification module 100A according to a first embodiment of the present disclosure. The power amplification module 100A is included in a transmission unit of a user terminal such as a cellular phone device. The transmission unit is for processing a transmission signal that is to be transmitted to a base station. In addition, although not illustrated in FIG. 1, the user terminal also includes a reception unit that is for processing a reception signal received from the base station. The transmission unit and the reception unit are provided as a single communication unit, for example.

The power amplification module 100A supports a plurality of communication standards (modes). In the example illustrated in FIG. 1, the power amplification module 100A supports a third generation mobile communication system (3G) (first communication mode) and a second generation mobile communication system (2G) (second communication mode). The communication standards supported by the power amplification module 100A are not limited to these communication standards, and the power amplification module 100A may support a fourth generation mobile communication system (4G) (first communication mode) or a fifth generation mobile communication system (5G), for example. In this embodiment, although an example is described in which the power amplification module 100A supports two communication standards, the power amplification module 100A may instead support three or more communication standards.

Furthermore, the power amplification module 100A supports a plurality of frequency bands (bands). In other words, the power amplification module 100A has a function of amplifying the powers of RF signals of a plurality of frequency bands. In the example illustrated in FIG. 1, the power amplification module 100A supports a 3G high band and a 3G low band, and a 2G high band and a 2G low band. For the 3G high band, there is band 1 (frequency band: 1920-1980 MHz) for example, and for the 3G low band, there is band 8 (frequency band: 880-915 MHz) for example. In addition, for the 2G bands, there are Global System for Mobile Communications (GSM®) high and low bands. The 3G and 2G frequency bands are not limited to these bands. Furthermore, the power amplification module 100A may support uplink carrier aggregation for simultaneously transmitting a plurality of transmission signals having different frequency bands.

Next, the constituent elements of the power amplification module 100A will be described. As illustrated in FIG. 1, the power amplification module 100A includes a 3G module 110A, a 2G module 120A and a duplexer 130.

The 3G module 110A (first module) and the 2G module 120A (second module) each include two amplifications paths, namely, a high-band amplification path and a low-band amplification path. Specifically, the 3G module 110A includes a switch circuit 10A, power amplifiers 20a and 20b, a band-switching circuit 30, input terminals IN1a and IN1b, and output terminals OUT1a and OUT1b. The 2G module 120A includes a switch circuit 12A, power amplifiers 22a and 22b, matching networks 40a and 40b, an antenna switch 50, input terminals IN2a and IN2b, and an output terminal OUT. First, 3G RF signals will be described as an example.

A 3G (first communication mode) or 2G (second communication mode) high-band RF signal is supplied to the 3G module 110A via the input terminal IN1a, and a 3G or 2G low-band RF signal is supplied to the 3G module 110A via the input terminal IN1b.

The switch circuit 10A (input switch circuit) includes switches SW1a and SW1b. The switch SW1a switches and outputs a 3G or 2G high-band RF signal supplied from the input terminal IN1a to the power amplifier 20a, a line L1a or a line L3a. Similarly, the switch SW1b switches and outputs a 3G or 2G low-band RF signal supplied from the input terminal IN1b to the power amplifier 20b, a line L1b or a line L3b. Switching of the RF signals will be described in detail later.

The power amplifier 20a (first amplifier) and the power amplifier 20b (first amplifier) are amplifiers for amplifying the powers of RF signals, and are formed using transistors (amplifying elements). For example, the transistors are bipolar transistors such as a Heterojunction Bipolar Transistors (HBTs). Alternatively, Metal-Oxide-Semiconductor Field Effect Transistors (MOSFETs) may be used as the transistors. Specifically, the power amplifier 20a amplifies a high-band RF signal supplied from the switch SW1a, and outputs an amplified signal (first amplified signal) to the band-switching circuit 30. Similarly, the power amplifier 20b amplifies a low-band RF signal supplied from the switch SW1b, and outputs an amplified signal (first amplified signal) to the band-switching circuit 30. The number of power amplifier stages is not limited to one, and may be two or more.

On the basis of the frequency band of an RF signal output from the power amplifier 20a or 20b or the line L1a or L1b, the band-switching circuit 30 allocates and outputs the RF signal to the duplexer 130 that handles the frequency band corresponding to the RF signal.

The duplexer 130 outputs RF signals supplied from the band-switching circuit 30 to the antenna switch 50 of the 2G module 120A. The duplexer 130 is for example formed using a Low Pass Filter (LPF), a Band Pass Filter (BPF) and so on. The duplexer 130 processes a reception signal received from an antenna (not illustrated), but description of such a reception signal is omitted from this specification.

The antenna switch 50 (output switch circuit) switches an RF signal supplied thereto in accordance with the communication mode and frequency band of the RF signal, and supplies the RF signal to the antenna via the output terminal OUT. The antenna switch 50 supplies a reception signal received by the antenna to the duplexer 130.

Next, the configuration of the switch circuit 10A used to switch an RF signal will be described by taking a case in which the RF signal is a high-band RF signal as an example. A similar configuration to that for a high-band RF signal is used for a low-band RF signal, and therefore description thereof is omitted. First, in the case where an RF signal supplied to the switch SW1a is a 2G RF signal, the RF signal is supplied to the line L3a (inter-module line). The line L3a is an inter-module line that connects the output terminal OUT1a of the 3G module 110A and the input terminal IN2a of the 2G module 120A to each other. Therefore, the 2G RF signal is supplied to the 2G module 120A via the line L3a. Next, in the case where the RF signal supplied to the switch SW1a is a 3G RF signal and a desired output level (for example, the output level required to transmit the RF signal to a base station) is equal to or greater than a reference level (hereafter, also referred to as "amplification mode"), the RF signal is supplied to the power amplifier 20a. On the other hand, in the case where the RF signal supplied to the switch SW1a is a 3G RF signal and the desired output level is less than the reference level (hereafter, also referred to as "non-amplification mode"), the RF signal is supplied to the line L1a (first bypass line). The line L1a connects the switch SW1a and the band-switching circuit 30 without necessarily passing through the power amplifier 20a. In other words, the line L1a is a line that bypasses the power amplifier 20a (bypass line). An RF signal supplied to the line L1a is supplied to the band-switching circuit 30 without necessarily being subjected to power amplification. Thus, the antenna switch 50 (output switch circuit) outputs an amplified signal obtained by an RF signal being amplified by the power amplifier 20a in the case of the amplification mode, and outputs an RF signal that has passed along the line L1a in the case of the non-amplification mode. Therefore, since operation of the power amplifier 20a is halted in the case of the non-amplification mode, current consumption can be reduced.

Next, the case of a 2G RF signal will be described. A 2G high-band RF signal is supplied to the 2G module 120A via the input terminal IN2a, and a 2G low-band RF signal is supplied to the 2G module 120A via the input terminal IN2b.

The switch circuit 12A (input switch circuit) includes switches SW2a and SW2b. The switch SW2a switches and outputs a high-band RF signal supplied from the input terminal IN2a to the power amplifier 22a or a line L2a. Similarly, the switch SW2b switches and outputs a low-band RF signal supplied from the input terminal IN2b to the power amplifier 22b or a line L2b.

The power amplifiers 22a (second amplifier) and 22b (second amplifier) are amplifiers for amplifying the powers of RF signals, and are formed of transistors. Specifically, the power amplifier 22a amplifies a high-band RF signal supplied from the switch SW2a, and outputs an amplified signal (second amplified signal) to the matching network 40a. Similarly, the power amplifier 22b amplifies a low-band RF signal supplied from the switch SW2b, and outputs an amplified signal (second amplified signal) to the matching network 40b. The number of power amplifier stages is not limited to one, and may be two or more.

The matching networks 40a and 40b are circuits for matching impedances between the power amplifiers 22a and 22b and the antenna switch 50, and are formed using capacitors and inductors. In the example illustrated in FIG. 1, the matching networks 40a and 40b are configured as low pass filters (LPFs). The matching networks 40a and 40b are not limited to this configuration, and may instead be configured as band pass filters (BPFs), for example. In addition, the 3G module 110A includes the duplexer 130 instead of the matching networks 40a and 40b, and therefore does not need to include matching networks.

For 2G RF signals as well, similarly to as in the case of 3G RF signals, in the case where an RF signal supplied to the switch SW2a is a 2G RF signal and the mode is the amplification mode, the RF signal is supplied to the power amplifier 22a. On the other hand, in the case where the RF signal supplied to the switch SW2a is a 2G RF signal and the mode is the non-amplification mode, the RF signal is supplied to the line L2a (second bypass line). In other words, the line L2a is a line that bypasses the power amplifier 22a (bypass line). Thus, the antenna switch 50 outputs an amplified signal obtained by an RF signal being amplified by the power amplifier 22a in the case of the amplification mode, and outputs an RF signal that has passed along the line L2a in the case of the non-amplification mode. Therefore, since operation of the power amplifier 22a is halted in the case of the non-amplification mode, current consumption can be reduced.

Due to the above-described configuration, in the power amplification module 100A, an RF signal is switched and supplied to the power amplifier 20a, 20b, 22a or 22b, or the line L1a, L1b, L2a or L2b in accordance with the desired output level of the RF signal in both the 3G module 110A and the 2G module 120A. Therefore, in the case where the desired output level of the power amplification module is less than the reference level, operation of the power amplifiers can be halted, and as a result, current consumption can be reduced.

In addition, in the power amplification module 100A, 3G and 2G high-band and low-band RF signals are supplied using the two input terminals IN1a and IN1b of the 3G module 110A. In other words, it is sufficient for a transmission circuit that generates an RF signal to have two output terminals, and therefore an increase in circuit scale is suppressed compared with a configuration in which an output terminal is provided for each communication mode and each frequency band.

In addition, in the power amplification module 100A, the switch circuits 10A and 12A may be formed using switch circuits mounted in a module in the configuration disclosed in Japanese Unexamined Patent Application Publication No. 2016-42700, for example. Thus, there is no need to newly add terminals to allow the switch circuits 10A and 12A to be provided, and the manufacturing cost can be suppressed.

In addition, in the case where the power amplification module 100A includes a control circuit that controls the gain of the power amplifiers, the switch circuits 10A and 12A may each have a structure in which an RF signal is supplied to the power amplifier 20a, 20b, 22a or 22b, or the line L1a, L1b, L2a or L2b on the basis of a control signal output from the control circuit. Thus, there is no need to newly add a control circuit for controlling the switch circuits 10A and 12A, and manufacturing cost can be suppressed.

Furthermore, differences in the desired output levels of RF signals may differ depending on the communication modes and frequency bands, for example. Specifically, the output power level required for a transmission signal of a cellular phone device is around minus several tens of dBm to several tens of dBm, for example.

In addition, 3G power amplifiers and 2G power amplifiers are not limited to being mounted as separate modules, and may instead be mounted as a combined module. Furthermore, an example is illustrated in FIG. 1 in which the duplexer 130 is mounted outside the 3G module 110A, but the duplexer may instead be mounted inside the 3G module. In addition, an example is illustrated in FIG. 1 in which the antenna switch 50 is mounted inside the 2G module 120A, but the antenna switch may instead be mounted outside the 2G module. The 3G module and the 2G module may be formed on a single chip.

Figure 2:
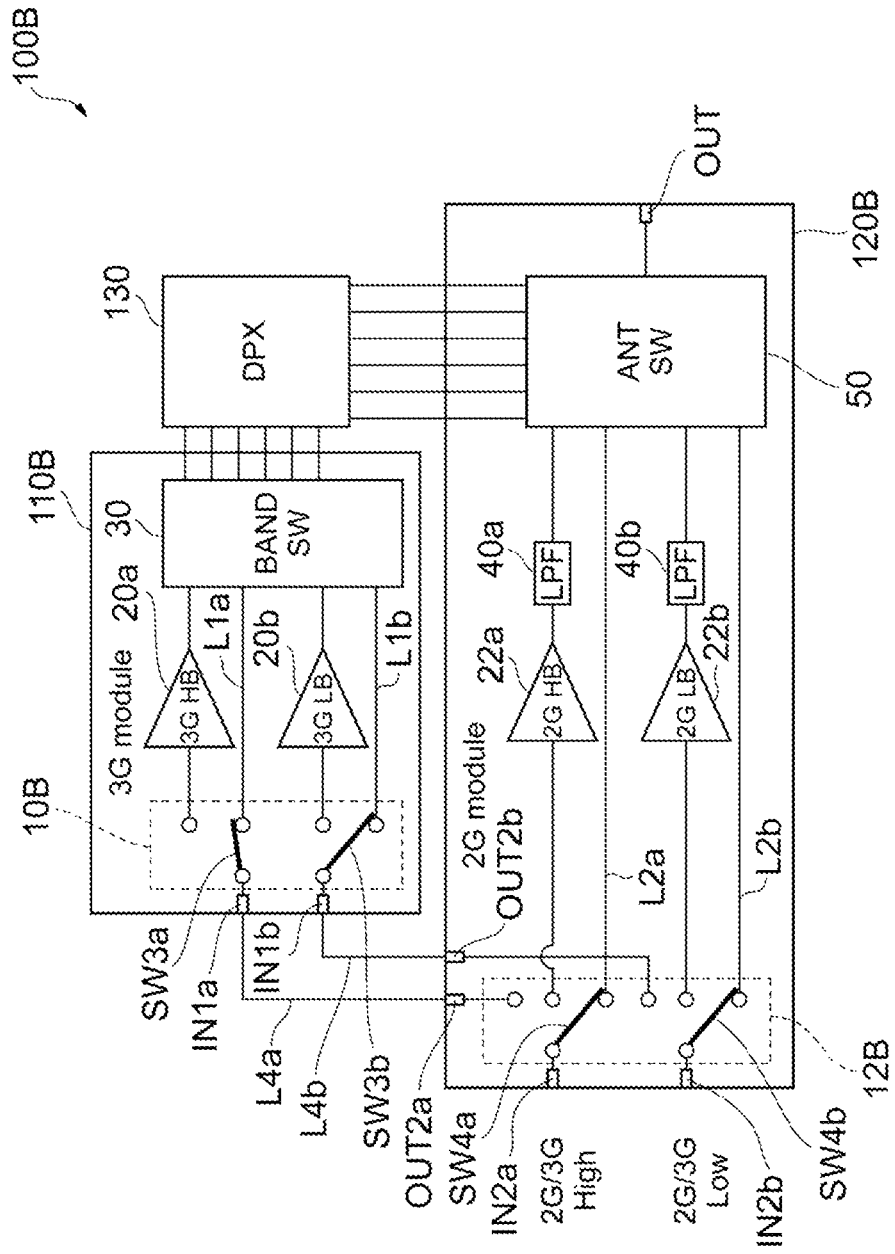
FIG. 2 illustrates the configuration of a power amplification module according to a second embodiment of the present disclosure.

FIG. 2 illustrates the configuration of a power amplification module 100B according to a second embodiment of the present disclosure. Elements that are the same as those of the power amplification module 100A are denoted by the same symbols and description thereof is omitted. In the second embodiment and embodiments thereafter, description of matters common to the first embodiment is omitted and only the points of difference are described. In particular, the same operational effects resulting from the same configurations are not repeatedly described in the individual embodiments. Compared with the configuration of the power amplification module 100A, the power amplification module 100B includes a 3G module 110B instead of the 3G module 110A, and a 2G module 120B instead of the 2G module 120A.

The power amplification module 100B differs from the power amplification module 100A illustrated in FIG. 1 in that both 3G and 2G RF signals are supplied to the 2G module 120B. Specifically, in the power amplification module 100B, a 3G or 2G high-band RF signal is supplied to the input terminal IN2a of the 2G module 120B, and a 3G or 2G low-band RF signal is supplied to the input terminal IN2b of the 2G module 120B.

The 3G module 110B and the 2G module 120B respectively include switch circuits 10B and 12B instead of the switch circuits 10A and 12A. The switch circuit 10B includes switches SW3a and SW3b. Similarly to the switches SW2a and SW2b of the switch circuit 12A illustrated in FIG. 1, the switches SW3a and SW3b respectively switch and output 3G RF signals supplied from the input terminals IN1a and IN1b to the power amplifier 20a or 20b, or the line L1a or L1b. In addition, the switch circuit 12B includes switches SW4a and SW4b. Similarly to the switches SW1a and SW1b of the switch circuit 10A illustrated in FIG. 1, the switches SW4a and SW4b respectively switch and output 3G or 2G RF signals supplied from the input terminals IN2a and IN2b to the power amplifier 22a or 22b, the line L2a or L2b, or the line L4a or L4b. Similarly to the lines L3a and L3b illustrated in FIG. 1, the lines L4a and L4b are inter-module lines that respectively connect an output terminal OUT2a of the 2G module 120B and the input terminal IN1a of the 3G module 110B, and an output terminal OUT2b of the 2G module 120B and the input terminal IN1b of the 3G module 110B.

With this configuration as well, in accordance with the desired output level, the power amplification module 100B can supply an RF signal to the power amplifier 20a, 20b, 22a or 22b in the case of the amplification mode, and can supply an RF signal to the line L1a, L1b, L2a or L2b in the case of the non-amplification mode. Therefore, the power amplification module 100B can achieve the same effect as the power amplification module 100A.

Figure 3:
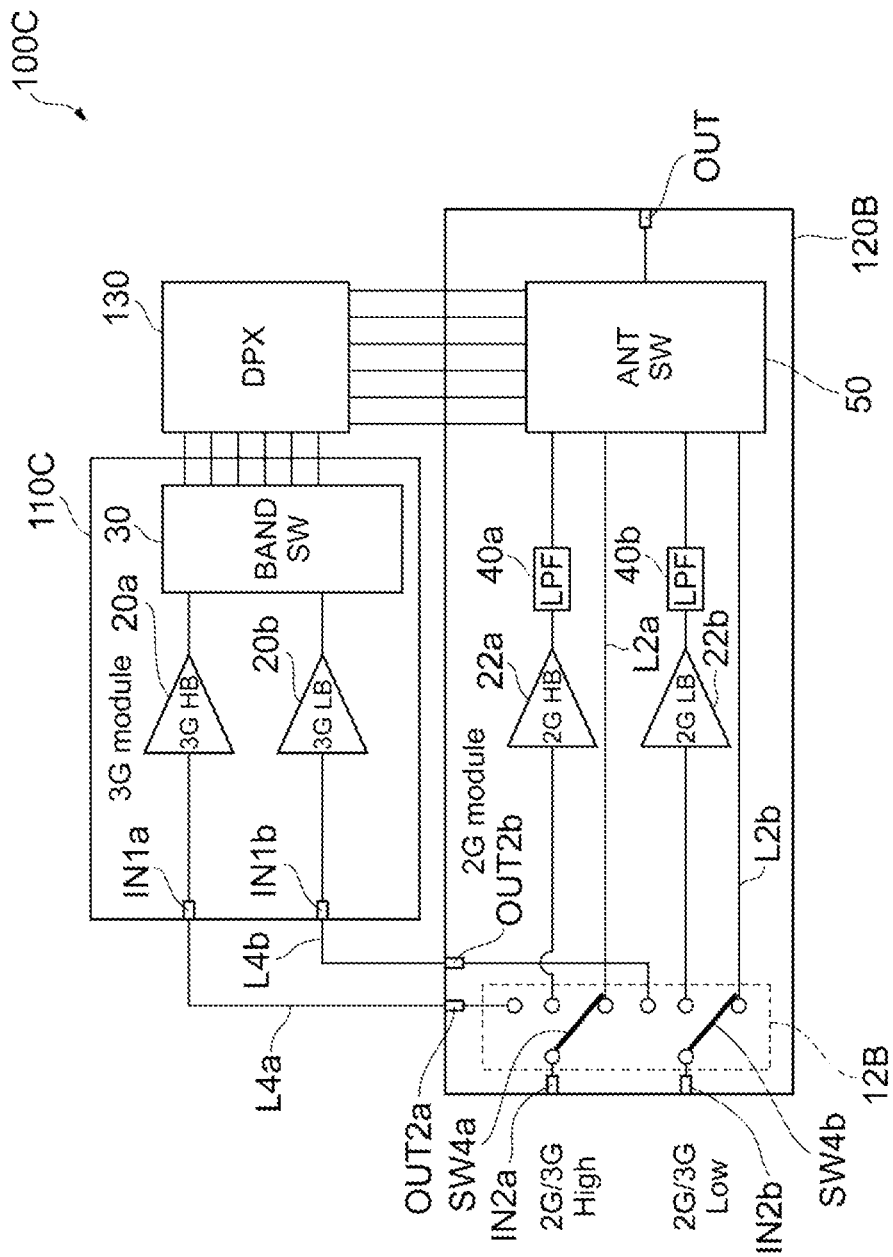
FIG. 3 illustrates the configuration of a power amplification module according to a third embodiment of the present disclosure.

FIG. 3 illustrates the configuration of a power amplification module 100C according to a third embodiment of the present disclosure. Elements that are the same as those of the power amplification module 100A are denoted by the same symbols and description thereof is omitted. Compared with the configuration of the power amplification module 100B, the power amplification module 100C includes a 3G module 110C instead of the 3G module 110B.

Compared with the 3G module 110B, the 3G module 110C does not include the switch circuit 10B and the lines L1a and L1b. In other words, in the power amplification module 100C, the 3G module 110C does not include lines that bypass power amplifiers, and instead, the lines L2a and L2b of the 2G module 120B are shared by 3G and 2G RF signals. Specifically, 3G RF signals that are supplied to the input terminals IN2a and IN2b of the 2G module 120B are respectively supplied to the 3G module 110C via the lines L4a and L4b in the case of the amplification mode, and are respectively supplied to the lines L2a and L2b of the 2G module 120B in the case of the non-amplification mode. The processing of the 2G RF signals is the same as the processing performed in the power amplification module 100B illustrated in FIG. 2, and therefore detailed description thereof is omitted.

With this configuration as well, in accordance with the desired output level, the power amplification module 100C can supply an RF signal to the power amplifier 20a, 20b, 22a or 22b in the case of the amplification mode, and can supply an RF signal to the line L2a or L2b in the case of the non-amplification mode. Therefore, the power amplification module 100C can achieve the same effect as the power amplification module 100A.

In addition, in the power amplification module 100C, a 3G RF signal is supplied to the antenna switch 50 without necessarily passing through the band-switching circuit 30 and the duplexer 130 in the case of the non-amplification mode. Thus, compared with the configuration illustrated in FIG. 2, attenuation of an RF signal caused by the RF signal passing through the band-switching circuit 30 and the duplexer 130 (for example, on the order of several dB) can be suppressed. Therefore, the power amplification module 100C can further reduce current consumption in the case of the non-amplification mode compared with the power amplification modules 100A and 100B. Here, when a 3G RF signal is output from the output terminal OUT without necessarily passing through the duplexer 130, there is a possibility that a shaping level of the signal waveform of the 3G RF signal will be degraded compared with the power amplification modules 100A and 100B. However, since the output power is small in the case of the non-amplification mode compared with the case of the non-amplification mode, it can be said that the effect of the degradation of the shaping level will be small in transmission of an RF signal.

Figure 4:
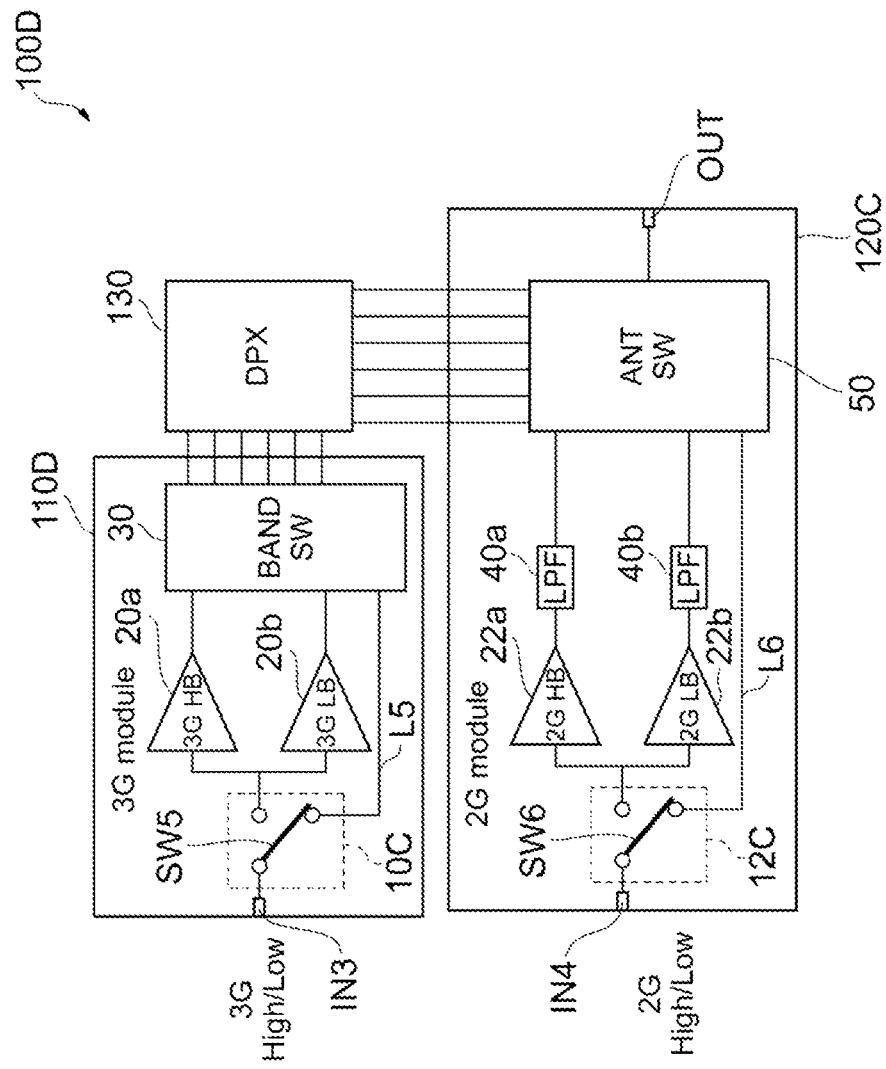
FIG. 4 illustrates the configuration of a power amplification module according to a fourth embodiment of the present disclosure.

FIG. 4 illustrates the configuration of a power amplification module 100D according to a fourth embodiment of the present disclosure. Elements that are the same as those of the power amplification module 100A are denoted by the same symbols and description thereof is omitted. Compared with the configuration of the power amplification module 100A, the power amplification module 100D includes a 3G module 110D instead of the 3G module 110A, and a 2G module 120C instead of the 2G module 120A.

The power amplification module 100D differs from the power amplification module 100A illustrated in FIG. 1 in that the 3G RF signals are supplied to the 3G module 110D, and the 2G RF signals are supplied to the 2G module 120C. Specifically, in the power amplification module 100D, the 3G RF signals are supplied to an input terminal IN3 of the 3G module 110D, and the 2G RF signals are supplied to an input terminal IN4 of the 2G module 120C.

The 3G module 110D includes a switch circuit 10C, which is provided with a switch SW5, instead of the switch circuit 10A. In addition, the 3G module 110D includes a line L5 that bypasses the power amplifiers 20a and 20b (bypass line) instead of the lines L1a and L1b. Similarly, the 2G module 120C includes a switch circuit 12C, which is provided with a switch SW6, instead of the switch circuit 12A. In addition, the 2G module 120C includes a line L6 that bypasses the power amplifiers 22a and 22b (bypass line) instead of the lines L2a and L2b.

Regardless of whether a 3G RF signal supplied from the input terminal IN3 is a high-band RF signal or a low-band RF signal, the switch SW5 supplies the RF signal to the power amplifiers 20a and 20b in the case of the amplification mode, and supplies the RF signal to the line L5 in the case of the non-amplification mode. Thus, compared with the 3G module 110A illustrated in FIG. 1, the number of lines that bypass power amplifiers can be reduced by one. Although an RF signal may be supplied to both the high-band power amplifier 20a and the low-band power amplifier 20b regardless of the frequency band of the RF signal in the case of the amplification mode, alternatively, the power amplifier on the side corresponding to the frequency band of the RF signal may be switched on and the power amplifier on the side not corresponding to the frequency band of the RF signal may be switched off in the case of the amplification mode. The processing of the RF signals in the 2G module 120C is the same as the processing of the RF signals in the 3G module 110D, and therefore detailed description thereof is omitted.

With this configuration as well, in accordance with the desired output level, the power amplification module 100D can supply an RF signal to the power amplifier 20a, 20b, 22a or 22b in the case of the amplification mode, and can supply an RF signal to the line L5 or L6 in the case of the non-amplification mode. Therefore, the power amplification module 100D can achieve the same effect as the power amplification module 100A.

In addition, as illustrated in FIG. 4, in this embodiment, the antenna switch 50 is mounted in the 2G module 120C. Thus, the antenna switch 50 may be mounted in the 2G module 120C.

Figure 5:
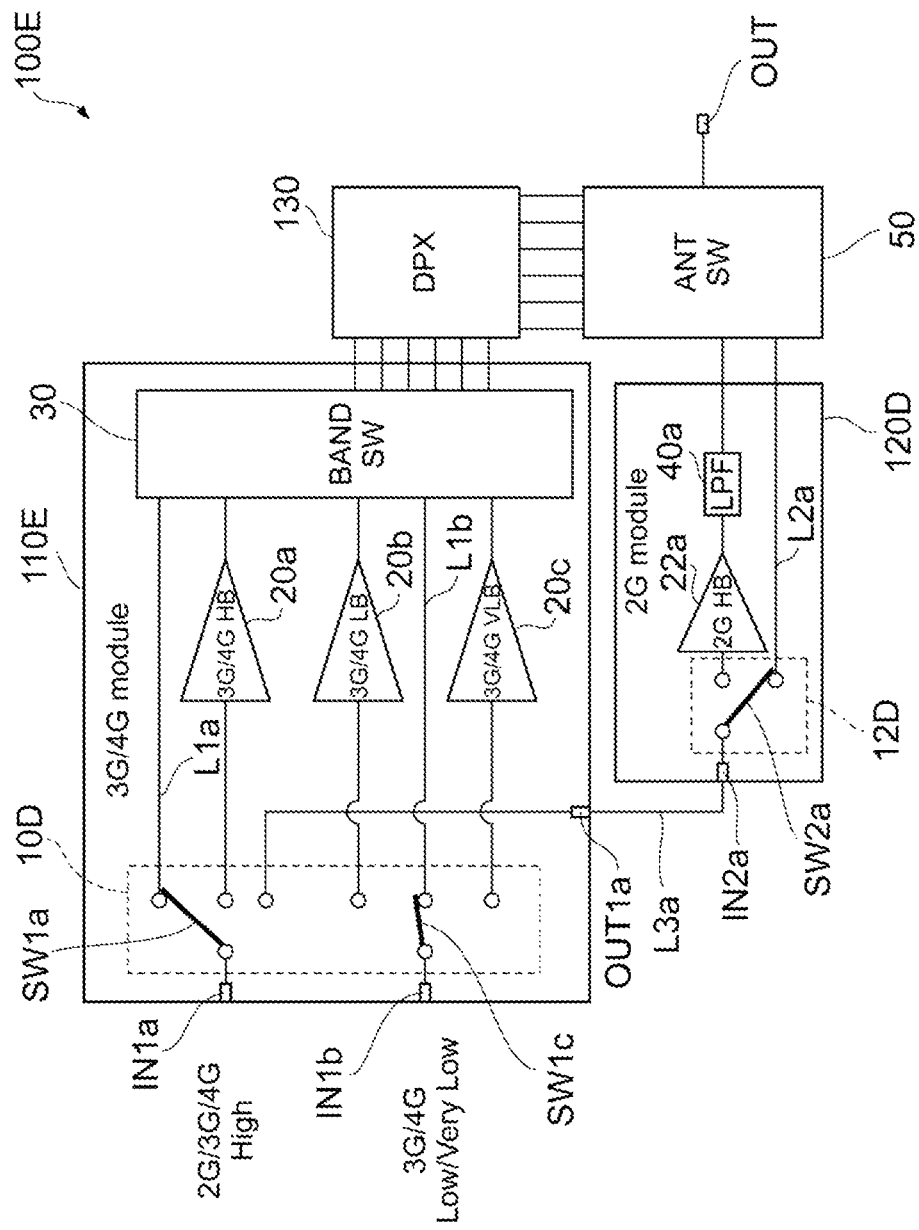
FIG. 5 illustrates the configuration of a power amplification module according to a fifth embodiment of the present disclosure.

FIG. 5 illustrates the configuration of a power amplification module 100E according to a fifth embodiment of the present disclosure. Elements that are the same as those of the power amplification module 100A are denoted by the same symbols and description thereof is omitted. Compared with the configuration of the power amplification module 100A, the power amplification module 100E includes a 3G/4G module 110E instead of the 3G module 110A, and a 2G module 120D instead of the 2G module 120A.

The 3G/4G module 110E is equipped with three amplification paths, namely, a 3G/4G high-band path, a 3G/4G low-band path, and a 3G/4G very-low-band path. Specifically, compared with the 3G module 110A illustrated in FIG. 1, the 3G/4G module 110E includes a switch circuit 10D instead of the switch circuit 10A, and further includes a power amplifier 20c. In addition, the 2G module 120D is not equipped with a low-band amplification path, and includes a switch circuit 12D instead of the switch circuit 12A. The term "very low band" refers to a band containing frequencies lower than those of the low band, and may be band 12 (frequency band: 699-716 MHz), for example.

The switch circuit 10D includes a switch SW1a and a switch SW1c. The switch SW1c switches and outputs a 3G or 4G low-band or very-low-band RF signal supplied from the input terminal IN1b to the power amplifier 20b or 20c, or to the line L1b. The power amplifier 20c (first amplifier) amplifies a very-low-band RF signal supplied from the switch SW1c, and outputs an amplified signal (first amplified signal) to the band-switching circuit 30.

With this configuration as well, in accordance with the desired output level, the power amplification module 100E can supply a very-low-band RF signal to the power amplifier 20c in the case of the amplification mode, and can supply a very-low-band RF signal to the line L1b in the case of the non-amplification mode. Therefore, the power amplification module 100E can achieve the same effect as the power amplification module 100A.

In addition, compared with the 2G module 120A illustrated in FIG. 1, the 2G module 120D is not equipped with a low-band amplification path. Thus, a 3G/4G module or a 2G module is not limited to having two amplification paths, and may instead have one, or three or more amplification paths.

In addition, as illustrated in FIG. 5, the line L1b that bypasses power amplifiers may be shared by RF signals of a plurality of bands, or a dedicated line may be provided for each band.

Figure 6:
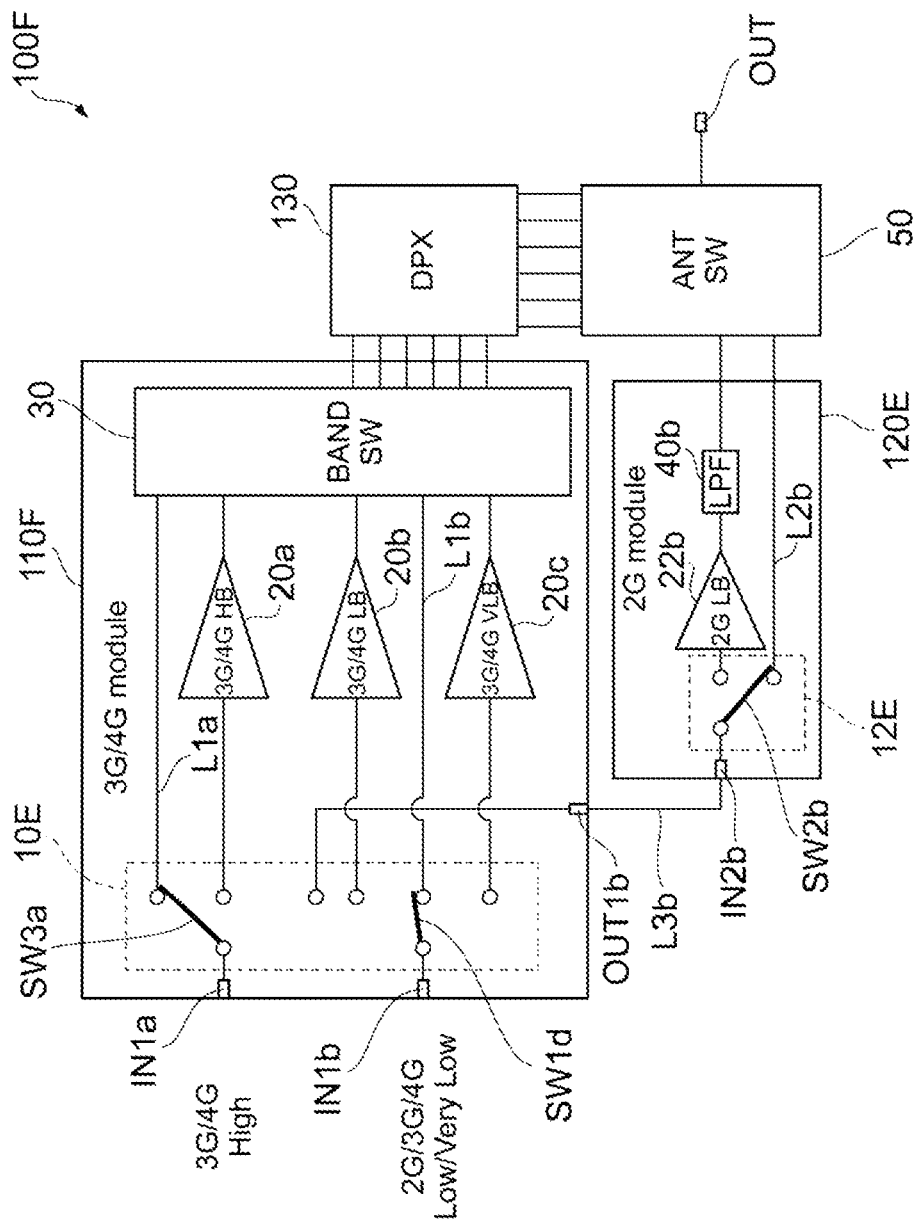
FIG. 6 illustrates the configuration of a power amplification module according to a sixth embodiment of the present disclosure.

FIG. 6 illustrates the configuration of a power amplification module 100F according to a sixth embodiment of the present disclosure. Elements that are the same as those of the power amplification module 100A are denoted by the same symbols and description thereof is omitted. Compared with the configuration of the power amplification module 100E illustrated in FIG. 5, the power amplification module 100F includes a 3G/4G module 110F instead of the 3G/4G module 110E, and includes a 2G module 120E instead of the 2G module 120D.

Similarly to the 3G/4G module 110E, the 3G/4G module 110F is equipped with three amplification paths, namely, a 3G/4G high-band path, a 3G/4G low-band path, and a 3G/4G very-low-band path. Specifically, compared with the 3G/4G module 110E illustrated in FIG. 5, the 3G/4G module 110F includes a switch circuit 10E instead of the switch circuit 10D. The switch circuit 10E includes a switch SW3a and a switch SW1d. In the case where an RF signal supplied from the input terminal IN1b is a 2G RF signal, the switch SW1d supplies the RF signal to the line L3b, and in the case where the RF signal supplied from the input terminal IN1b is a 3G or 4G RF signal, the switch SW1d switches and outputs the RF signal to the power amplifier 20b or 20c, or the line L1b.

Furthermore, the 2G module 120E includes a low-band amplification path instead of the high-band amplification path illustrated in FIG. 5, and includes a switch circuit 12E instead of the switch circuit 12D. The switch circuit 12E includes a switch SW2b. Thus, the amplification path of a 2G module may be a high-band path or a low-band path.

With this configuration as well, in accordance with the desired output level, the power amplification module 100F can supply a very-low-band RF signal to the power amplifier 20c in the case of the amplification mode, and can supply a very-low-band RF signal to the line L1b in the case of the non-amplification mode. Therefore, the power amplification module 100F can achieve the same effect as the power amplification module 100A.

Exemplary embodiments of the present disclosure have been described above. The power amplification modules 100A to 100F include 3G or 4G power amplifiers 20a, 20b and 20c, 2G power amplifiers 22a and 22b, and lines L1a, L1b, L2a, L2b, L5 and L6 that bypass the power amplifiers, and in the case where a desired output level is equal to or higher than a reference level, the power amplification modules supply a RF signal to a power amplifier, and in the case where the desired output level is less than the reference level, the power amplification modules supply the RF signal to a line. Thus, operation of the power amplifiers can be halted in the case where the output level is less than the reference level. Therefore, current consumption of the power amplification modules can be reduced.

Furthermore, the configurations of the lines included in the power amplification modules 100A to 100F are not particularly limited, and 3G lines L1a, L1b and L5 and 2G lines L2a, L2b and L6 may be included, for example.

In addition, the power amplification modules 100A, 100B, 100D, 100E and 100F may include the duplexer 130 that is supplied with an amplified signal output from the power amplifier 20a, 20b or 20c, or an RF signal output from the line L1a, L1b or L5. The power amplification modules are not limited to these configurations.

In addition, the power amplification modules 100A, 100E and 100F respectively include a 3G module 110A, and 3G/4G modules 110E and 110F, and 2G modules 120A, 120D and 120E, and a 2G RF signal is supplied to the 2G module via the line L3a or L3b after being supplied to the 3G module or the 3G/4G module. Thus, 4G, 3G and 2G high-band and low-band RF signals are supplied using two input terminals IN1a and IN1b of a 3G module. Therefore, it is sufficient for a transmission circuit that generates an RF signal to have two output terminals, and an increase in circuit scale is suppressed compared with a configuration in which an output terminal is provided for each communication mode and each frequency band.

In addition, the power amplification module 100C includes the 3G module 110C and the 2G module 120B, and a 3G RF signal is supplied to the line L2a or L2b of the 2G module in the case where the desired output level is less than the reference level. Thus, compared with the configurations of the power amplification modules 100A, 100B, 100D, 100E and 100F, attenuation of an RF signal caused by the RF signal passing through the band-switching circuit 30 and the duplexer 130 can be suppressed. Therefore, current consumption of the power amplification module can be further reduced in the case where the desired output level is less than the reference level.

In addition, the power amplification modules 100A to 100F may have a structure in which an RF signal is supplied to a power amplifier or a line on the basis of a control signal output from a control circuit that controls the gains of the power amplifiers. Thus, there is no need to newly add a control circuit for controlling the switch circuits 10A to 10E and 12A to 12E, and manufacturing cost can be suppressed. The power amplification modules are not limited to these configurations.

In addition, the power amplification modules 100A to 100F may include a 3G or 4G mode as a first communication mode, and a 2G mode as a second communication mode. The communication modes supported by the power amplification module are not limited to these modes.

The purpose of the embodiments described above is to enable easy understanding of the present invention, and the embodiments are not to be interpreted as limiting the present invention. The present invention can be modified or improved without departing from the gist of the invention, and equivalents to the present invention are also included in the present invention. In other words, appropriate design changes made to the embodiments by those skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, each embodiment is merely an illustrative example and it goes without saying that parts of the configurations illustrated in different embodiments can be substituted for each other or combined with each other and these new configurations are also included in the scope of the present invention so long as the configurations have the characteristics of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplification module comprising:
a first amplifier configured to amplify a radio frequency (RF) signal according to a first communication mode;
a second amplifier configured to amplify the RF signal according to a second communication mode;
a first bypass line that bypasses the first or second amplifier;
an input switch circuit that supplies the RF signal to the first or second amplifier in accordance with a communication mode when a desired output level is equal to or greater than a reference level, and that supplies the RF signal to the first bypass line when the desired output level is less than the reference level; and
an output switch circuit that outputs a first amplified signal output from the first amplifier or a second amplified signal output from the second amplifier when the desired output level is equal to or greater than the reference level, and that outputs the RF signal output from the first bypass line when the desired output level is less than the reference level.

2. The power amplification module according to claim 1, further comprising a second bypass line, wherein when the desired output level is less than the reference level:
the input switch supplies the RF signal to the first bypass line when the RF signal corresponds to the first communication mode, and supplies the RF signal to the second bypass line when the RF signal corresponds to the second communication mode, and
the output switch circuit outputs the RF signal output from the first or second bypass line.

3. The power amplification module according to claim 2, further comprising:
a duplexer that supplies the first amplified signal output from the first amplifier or the RF signal output from the first bypass line to the output switch circuit.

4. The power amplification module according to claim 2, wherein:
the first amplifier and the first bypass line are mounted together as a first module;
the second amplifier and the second bypass line are mounted together as a second module;
an inter-module line connects the first module and the second module;
the first module comprises an input terminal configured to receive the RF signal when the RF signal corresponds to the first or second communication mode,
when the desired output level is equal to or greater than the reference level, the input switch circuit supplies the RF signal to the first amplifier when the RF signal corresponds to the first communication mode, and supplies the RF signal to the second amplifier via the inter-module line when the RF signal corresponds to the second communication mode, and
when the desired output level is less than the reference level, the input switch supplies the RF signal to the first bypass line when the RF signal corresponds to the first communication mode, and supplies the RF signal to the second bypass line via the inter-module line when the RF signal corresponds to the second communication mode.

5. The power amplification module according to claim 3, wherein:
the first amplifier and the first bypass line are mounted together as a first module;
the second amplifier and the second bypass line are mounted together as a second module;
an inter-module line connects the first module and the second module;
the first module comprises an input terminal configured to receive the RF signal when the RF signal corresponds to the first or second communication mode;
when the desired output level is equal to or greater than the reference level, the input switch circuit supplies the RF signal to the first amplifier when the RF signal corresponds to the first communication mode, and supplies the RF signal to the second amplifier via the inter-module line when the RF signal corresponds to the second communication mode; and
when the desired output level is less than the reference level, the input switch supplies the RF signal to the first bypass line when the RF signal corresponds to the first communication mode, and supplies the RF signal to the second bypass line via the inter-module line when the RF signal corresponds to the second communication mode.

6. The power amplification module according to claim 1, further comprising: a duplexer that supplies the first amplified signal output from the first amplifier to the output switch circuit, wherein:
the first amplifier is mounted as a first module;
the second amplifier and the bypass line are mounted together as a second module;
an inter-module line connects the first module and the second module;
the second module comprises an input terminal configured to receive the RF signal;
when the desired output level is equal to or greater than the reference level, the input switch circuit supplies the RF signal to the first amplifier via the inter-module line when the RF signal corresponds to the first communication mode, and supplies the RF signal to the second amplifier when the RF signal corresponds to the second communication mode; and
when the desired output level is less than the reference level, the input switch supplies the RF signal to the first bypass line.

7. The power amplification module according to claim 1, further comprising:
a control circuit configured to control a gain of the first or second amplifier, wherein the input switch circuit supplies the RF signal to the first or second amplifier or the first bypass line based on a control signal output from the control circuit.

8. The power amplification module according to claim 2, further comprising:
a control circuit configured to control a gain of the first or second amplifier, wherein the input switch circuit supplies the RF signal to the first or second amplifier or the first bypass line based on a control signal output from the control circuit.

9. The power amplification module according to claim 3, further comprising:

a control circuit configured to control a gain of the first or second amplifier, wherein the input switch circuit supplies the RF signal to the first or second amplifier or the first bypass line based on a control signal output from the control circuit.

10. The power amplification module according to claim 4, further comprising:
a control circuit configured to control a gain of the first or second amplifier, wherein the input switch circuit supplies the RF signal to the first or second amplifier or the first bypass line based on a control signal output from the control circuit.

11. The power amplification module according to claim 5, further comprising:
a control circuit configured to control a gain of the first or second amplifier, wherein the input switch circuit supplies the RF signal to the first or second amplifier or the first bypass line based on a control signal output from the control circuit.

12. The power amplification module according to claim 6, further comprising:
a control circuit configured to control a gain of the first or second amplifier, wherein the input switch circuit supplies the RF signal to the first or second amplifier or the first bypass line based on a control signal output from the control circuit.

13. The power amplification module according to claim 1, wherein the first communication mode is a 3G mode or a 4G mode, and the second communication mode is a 2G mode.

14. The power amplification module according to claim 2, wherein the first communication mode is a 3G mode or a 4G mode, and the second communication mode is a 2G mode.

15. The power amplification module according to claim 3, wherein the first communication mode is a 3G mode or a 4G mode, and the second communication mode is a 2G mode.

16. The power amplification module according to claim 4, wherein the first communication mode is a 3G mode or a 4G mode, and the second communication mode is a 2G mode.

17. The power amplification module according to claim 5, wherein the first communication mode is a 3G mode or a 4G mode, and the second communication mode is a 2G mode.

18. The power amplification module according to claim 6, wherein the first communication mode is a 3G mode or a 4G mode, and the second communication mode is a 2G mode.

* * * * *